(12) United States Patent
Sridharan et al.

(10) Patent No.: US 9,540,274 B2
(45) Date of Patent: Jan. 10, 2017

(54) LOW-MELTING LEAD-FREE BISMUTH SEALING GLASSES

(75) Inventors: Srinivasan Sridharan, Strongsville, OH (US); John J. Maloney, Solon, OH (US); Chandrashekhar Khadilkar, Broadview Heights, OH (US); Robert P. Blonski, North Royalton, OH (US); David L. Widlewski, Parma Heights, OH (US)

(73) Assignee: Ferro Corporation, Mayfield Heights, OH (US)

( * ) Notice: Subject to any disclaimer, the term of this patent is extended or adjusted under 35 U.S.C. 154(b) by 204 days.

(21) Appl. No.: 13/641,046

(22) PCT Filed: Apr. 15, 2011

(86) PCT No.: PCT/US2011/032689
§ 371 (c)(1),
(2), (4) Date: Dec. 12, 2012

(87) PCT Pub. No.: WO2011/130632
PCT Pub. Date: Oct. 20, 2011

(65) Prior Publication Data
US 2013/0104980 A1    May 2, 2013

Related U.S. Application Data

(60) Provisional application No. 61/324,356, filed on Apr. 15, 2010.

(51) Int. Cl.
*C03C 8/24* (2006.01)
*C03C 27/10* (2006.01)
(Continued)

(52) U.S. Cl.
CPC ............. *C03C 8/24* (2013.01); *B81C 1/00317* (2013.01); *C03C 8/22* (2013.01); *C03C 27/10* (2013.01);
(Continued)

(58) Field of Classification Search
CPC ................ C03C 8/18; C03C 8/24; C03C 8/14; C03C 8/02; C03C 8/04; C03C 17/04; C03C 3/066; C03C 3/064; C03C 3/062; C03C 3/122; C03C 8/12; C03C 2207/02; C03C 27/04; C03C 3/074; C03C 3/14; C03C 3/15; C03C 3/155; H01J 11/12; H01J 9/261; H01J 9/242; H01J 11/36; H01J 29/864; H01J 9/241; H01J 11/48; H01J 61/366; H01J 61/36; H01J 61/305; H01J 9/20; H01J 9/185; H01J 9/323; H01J 17/49; H01J 29/862
(Continued)

(56) References Cited
U.S. PATENT DOCUMENTS 5,252,521 A   10/1993  Roberts
5,733,828 A    3/1998  Usui et al.
(Continued)

FOREIGN PATENT DOCUMENTS

JP          2168927 A1  *  3/2010  ............. C03C 3/066
WO     2009/086228 A1      7/2009
WO   WO 2009086228 A1  *  7/2009  ............. H05B 33/04

*Primary Examiner* — Jodi C Franklin
(74) *Attorney, Agent, or Firm* — Rankin, Hill & Clark LLP (57) ABSTRACT

Glasses comprising Bi2O3, ZnO B2O3 and optionally a colorant including an oxide of a metal such as iron, cobalt, manganese, nickel, copper and chromium are suitable to form hermetic seals in solar cell modules, architectural glass windows and MEMS devices. Glass frit and paste compositions suitable for flow and bonding to various substrates—
(Continued)

glass, metal, silicon, in the temperature range of 400-500 degrees Centigrade. The broad compositional range in mole % is 25-70% $Bi_2O_3$, up to 65% ZnO, and 1-70% $B_2O_3$. Such glasses do not have batched in alumina or silica. Such glasses lack alumina and silica.

24 Claims, 3 Drawing Sheets (51) Int. Cl.
  H01L 31/048    (2014.01)
  B81C 1/00      (2006.01)
  H01L 23/29     (2006.01)
  H01L 31/0203   (2014.01)
  C03C 8/22      (2006.01)

(52) U.S. Cl.
  CPC ......... H01L 23/291 (2013.01); H01L 31/0203 (2013.01); H01L 31/048 (2013.01); *B81C 2203/019* (2013.01); *H01L 2224/48091* (2013.01); *H01L 2224/48465* (2013.01); *H01L 2924/09701* (2013.01); *H01L 2924/12044* (2013.01); *H01L 2924/1461* (2013.01); *Y02E 10/50* (2013.01); *Y10T 428/1314* (2015.01)

(58) Field of Classification Search
  USPC .................................. 65/32.2, 33.5–33.6, 34
  See application file for complete search history.

(56) References Cited

U.S. PATENT DOCUMENTS

| | | |
|---|---|---|
| 6,255,239 B1 | 7/2001 | Sakoske |
| 6,497,962 B1 | 12/2002 | Fujimine et al. |
| 7,291,573 B2 | 11/2007 | Ide |
| 8,307,674 B2 | 11/2012 | Gardner et al. |
| 2003/0228471 A1 | 12/2003 | Hayakawa et al. |
| 2006/0105898 A1 | 5/2006 | Ide |
| 2006/0174652 A1 | 8/2006 | Khanarian et al. |
| 2008/0300126 A1 | 12/2008 | Goedeke et al. |
| 2009/0042715 A1 | 2/2009 | Uchiyama et al. |
| 2009/0064717 A1 | 3/2009 | Son et al. |
| 2009/0101872 A1* | 4/2009 | Young et al. ............... 252/514 |
| 2009/0189126 A1 | 7/2009 | Prunchak |
| 2009/0247385 A1* | 10/2009 | Ide ..................... C03C 3/066 501/18 |

\* cited by examiner

Figure 1. MEMS device.

Figure 2: Schematic of solar cell module sealed with inventive sealing glass material

Figure 3.

LOW-MELTING LEAD-FREE BISMUTH SEALING GLASSES

BACKGROUND OF THE INVENTION

1. Field of Invention

The present invention relates to glass powders in the $Bi_2O_3$—$ZnO$—$B_2O_3$ system. Such glasses have low melting points and provide good flow characteristics with low or tunable crystallization tendencies.

2. Description of Related Art

Microelectromechanical systems ("MEMS") devices are microscale machines that perform work or measurements such as an accelerometer, rate sensor, actuator, pressure sensor and the like. Signal lines electrically connect the MEMS device to a microprocessor and/or to other circuitry. MEMS devices are plagued by the possibility that moisture, dirty air, dust and other foreign matter may enter the mechanism and cause premature failure or otherwise impede the operation of the MEMS device.

Sealing glass compositions used in MEMS device fabrication are typically applied using screen printing techniques, in which the sealing glass composition is deposited in the form of a paste that contains a particulate glass frit material (including crystalline additives for expansion modification), a thixotropic binder, and a solvent for the binder. The proportions of glass fits, additives, binder and solvent are adjusted to allow screen printing of a controlled volume of the paste on a designated bonding surface of one of the wafers, typically on the cap wafer. After drying, binder burn out (BBO) and pre-glazing, which removes all of the organic components from the glass frit bonding paste, the cap and device silicon wafers are aligned and then mated so that the glass frit particles contact complimentary bonding surfaces. The wafers are then incrementally heated to remelt, flow and impart wetting of the wafer surfaces by the glass frit so that upon cooling, the glass frit material re-solidifies to form a substantially homogeneous glass bond line between the wafers.

In MEMS bonding low firing temperatures are required to protect the properties of mechanical devices fabricated on MEMS wafers. In many of these applications, leaded glasses have been used as sealing glasses where very low firing temperatures are desired (less than 500° C.). However, environmental concerns typically rule out leaded glasses. Conventional lead-free glass powders do not flow sufficiently at temperatures less than 500° C. Phosphate and vanadate glasses in some situations have softening temperatures suitable for flow in this temperature range. However, such glasses are either not resistant to water attack (phosphate glasses often are water soluble) or crystallize too much before fusing and flow of glass powders. In the photovoltaic industry, there exists a need to develop glass based durable seals between glass plates to enhance the service life time of the photovoltaic devices that are being encapsulated from moisture attack. Currently the crystalline silicon solar cell is encapsulated with Ethylene Vinyl Acetate (EVA) polymer in between the glass superstrate and backsheet. The state of the art photovoltaic devices are at present encapsulated with organics as edge seals between glass substrates (for rigid cells). The desired lifetime for these cells is 25 to 30 years with the power output not to decrease below 70% of its initial value at the end of 30 years in the use environment. Often encapsulation with organic seals will not be impervious to moisture for this long period. Therefore more durable low-temperature glass based hermetic sealing technologies have to be developed to realize this desired lifetime with some certainty. Low sealing temperature is required to avoid unduly heating the solar cells being encapsulated. A similar need exists for low temperature glass based sealing technologies for sealing Organic LED devices. Similarly in the building industries there exists a need to replace organic based seals in windows with glass based durable seals to provide superior vacuum insulated glass windows.

In the photovoltaic industry the sealing glass compositions can be applied by a number of techniques such as screen printing, extrusion of pastes onto the glass substrates, ink jet printing (for thin layers), pad printing techniques, and tape casting method. The sealing glass can be either preglazed before the sealing step or can be directly sealed between glass plates in one step. The firing method can be either in conventional furnaces as well as by selective heating methods such as laser sealing, IR or visible light lamp sealing, induction sealing as well as microwave sealing.

Similar methods of paste applications and firing methods can be used in hermetic sealing of windows in the construction industry.

Accordingly, improvements in the art of low melting, high flow glasses, are needed.

BRIEF SUMMARY OF THE INVENTION

The present invention provides glass frit and paste compositions suitable for flow and bonding to various substrates—glass, metal, silicon, in the temperature range of 400-500° C. The broad compositional range in mole % is 25-70% $Bi_2O_3$, up to 65% $ZnO$, and 1-70% $B_2O_3$. Such glasses do not have batched in alumina or silica. Ideally, such glasses utterly lack alumina and silica.

Glasses in the $Bi_2O_3$—$ZnO$—$B_2O_3$ compositional space may have flow (seal) temperatures in the range of 300-600° C., preferably 350-550° C., more preferably 400-500° C., largely, it is believed, due to an intentional lack of silica and alumina. It is preferable to avoid oxides of refractory metals, and oxides that tend to raise the glass frit melt and flow temperatures.

An embodiment of the invention includes a lead-free and cadmium-free sealing glass composition, comprising, a first glass frit, comprising, prior to firing: (a) 25-65 mol % $Bi_2O_3$, (b) 3-60 mol % $ZnO$, (c) 4-65 mol % $B_2O_3$, (c) 0.1-25 mol %, preferably 0.1 to 15 mol % of at least one selected from the group consisting of $Fe_2O_3$, $Co_2O_3$, $MnO$, $NiO$, $Cr_2O_3$, $CuO$ and combinations thereof, (d) no intentionally added oxides of silicon, and (e) no intentionally added oxides of aluminum. Even though glass compositions are shown here using one oxidation state, various oxidation states of oxides of iron, cobalt, manganese, nickel, copper and chromium are suitable in the glass composition, such as $Cu_2O$, $CuO$, $CrO$, $CrO_2$, $Cr_2O_3$ and even combination oxides such as $CuCr_2O_4$. In solar applications, oxides including Mn, Fe and Co are preferred, especially $Fe_2O_3$, $Co_2O_3$, and $MnO$. In MEMS applications, oxides including Cu are preferred, especially $CuO$. Others not named will be evident to the skilled artisan.

Another embodiment of the invention includes a lead-free and cadmium-free sealing glass composition, comprising prior to firing: (a) 25-65 mol % $Bi_2O_3$, (b) 3-60 mol % $ZnO$, (c) 4-65 mol % $B_2O_3$, (c) no intentionally added oxides of silicon, and (d) no intentionally added oxides of aluminum.

Another embodiment of the invention includes a lead-free and cadmium-free sealing glass composition, comprising prior to firing: (a) 25-65 mol % $Bi_2O_3$, (b) 3-60 mol % $ZnO$, (c) 4-65 mol % $B_2O_3$, (c) 0.1-15 mol % of at least one selected from the group consisting of $Li_2O$, $K_2O$, $Na_2O$ and combinations thereof, (d) no intentionally added oxides of silicon, and (e) no intentionally added oxides of aluminum.

Another embodiment of the invention is a method of bonding first and second glass panels to one another, so as to hermetically seal and isolate a cavity defined therebetween, the method comprising (a) providing a first homogeneous powder glass sealing composition comprising: (i) 25-65 mol % $Bi_2O_3$, (ii) 3-60 mol % ZnO, (iii) 4-65 mol % $B_2O_3$, (iv) no intentionally added oxides of silicon, and (v) no intentionally added oxides of aluminum; (b) providing a second homogeneous powder glass sealing composition comprising: (i) 32-55 mol % $Bi_2O_3$, (ii) 15-45 mol % ZnO, (iii) 10-50 mol % $B_2O_3$, (iv) 0.1-15 mol % of at least one selected from the group consisting of CuO, $Fe_2O_3$, $Co_2O_3$, MnO, NiO, $Cr_2O_3$, (v) no intentionally added oxides of silicon, and (vi) no intentionally added oxides of aluminum; (c) mixing the first and second powders form a homogeneous mixture, (d) applying the homogeneous mixture to at least one of the first and second glass plates, (e) positioning the first and second glass plates such that the first and second powders come into contact with both glass plates, (f) firing at a temperature of 350-550° C., more preferably 400-550° C. to sinter and flow the first and second powders together thereby forming a hermetic seal defining a cavity between the first and second plates. In any embodiment where two glass plates or a glass plate to metal plate are sealed together, at least one solar cell may be located in the cavity formed therebetween.

Another embodiment of the invention is a method of bonding first and second glass panels to one another, so as to hermetically seal and isolate a cavity defined there between, the method comprising (a) providing a first homogeneous powder glass sealing composition comprising: (i) 25-65 mol % $Bi_2O_3$, (ii) 3-60 mol % ZnO, (iii) 4-65 mol % $B_2O_3$, (iv) no intentionally added oxides of silicon, and (v) no intentionally added oxides of aluminum; (iv) 0.1-25 mol % of at least one selected from the group consisting of CuO, $Fe_2O_3$, $Co_2O_3$, MnO, NiO, $Cr_2O_3$; (b) providing a second homogeneous powder glass sealing composition in the first glass compositional range but different from first glass; (c) mixing the first and second powders form a homogeneous mixture, (d) applying the homogeneous mixture to at least one of the first and second glass plates, (e) positioning the first and second glass plates such that the first and second powders come into contact with both glass plates, (f) firing at a temperature of 350-550° C., more preferably 400-550° C. to sinter and flow the first and second powders.

Yet another embodiment of the invention is a MEMS device including at least two silicon wafer substrates hermetically sealed with a fired glass powder composition, the powder comprising, prior to firing, (a) 32-55 mol % $Bi_2O_3$, (b) 10-45 mol % ZnO, (c) 10-50 mol % $B_2O_3$, (d) 1.5-9 mol % of at least one selected from the group consisting of CuO, $Fe_2O_3$, $Co_2O_3$, MnO, NiO, $Cr_2O_3$, and combinations thereof, (e) 0.1-20 mol % alkali metal oxides, (e) no intentionally added oxides of silicon, and (f) no intentionally added oxides of aluminum.

Still another embodiment of the invention is a MEMS device including at least two silicon wafer substrates hermetically sealed with a fired glass powder composition, the powder comprising, prior to firing, (a) 32-55 mol % $Bi_2O_3$, (b) 10-45 mol % ZnO, and (c) 10-50 mol % $B_2O_3$, (e) 0.1-20 mol % alkali metal oxides, (e) no intentionally added oxides of silicon, and (f) no intentionally added oxides of aluminum. Another embodiment of the invention includes a lead-free and cadmium-free sealing glass composition, comprising prior to firing: (a) 25-65 mol % $Bi_2O_3$, (b) 3-60 mol % ZnO, (c) 4-65 mol % $B_2O_3$, (d) 1.5-5 mol % $K_2O$, (d) no intentionally added oxides of silicon, and (e) no intentionally added oxides of aluminum.

Yet another embodiment of the invention is MEMS device including at least two silicon wafer substrates hermetically sealed with a fired glass powder composition, the powder comprising, prior to firing, (a) 32-55 mol % $Bi_2O_3$, (b) 10-45 mol % ZnO, (c) 10-50 mol % $B_2O_3$, (d) 1.5-9 mol % of at least one selected from the group consisting of CuO, $Fe_2O_3$, $Co_2O_3$, MnO, NiO, $Cr_2O_3$, and combinations thereof, (e) 0.1-20 mol % alkali metal oxides, (e) no intentionally added oxides of silicon, and (f) no intentionally added oxides of aluminum.

Still another embodiment of the invention is a solar cell array or module hermetically sealed within a glass vessel, the glass vessel bonded to at least one cap or cover, the bonding effectuated by a sintered glass composition, the sintered glass composition comprising, prior to firing, (a) a first homogeneous powder glass sealing composition comprising: (i) 25-65 mol % $Bi_2O_3$, (ii) 3-60 mol % ZnO, (iii) 4-65 mol % $B_2O_3$, (iv) no intentionally added oxides of silicon, and (v) no intentionally added oxides of aluminum; and (b) a second homogeneous powder glass sealing composition comprising: (i) 37-45 mol % $Bi_2O_3$, (ii) 30-40 mol % ZnO, (iii) 18-35 mol % $B_2O_3$, (iv) 0.1-15 mol % of at least one selected from the group consisting of CuO, $Fe_2O_3$, $Co_2O_3$, MnO, NiO, $Cr_2O_3$, (v) no intentionally added oxides of silicon, and (vi) no intentionally added oxides of aluminum.

Another embodiment of the invention is a solar cell array or module hermetically sealed within a cavity defined by at least two glass plates and a sintered mass of a glass composition connecting the at least two glass plates, the sintered glass composition comprising, prior to firing, (a) a first homogeneous powder glass sealing composition comprising: (i) 25-65 mol % $Bi_2O_3$, (ii) 3-60 mol % ZnO, (iii) 4-65 mol % $B_2O_3$, (iv) 0.1-25 mol % of at least one oxide of a metal selected from the group consisting of iron, cobalt, manganese, nickel, copper and chromium, (v) no intentionally added oxides of silicon, and (iv) no intentionally added oxides of aluminum; and (b) a second homogeneous powder glass sealing composition comprising: (i) 37-45 mol % $Bi_2O_3$, (ii) 30-40 mol % ZnO, (iii) 18-35 mol % $B_2O_3$, (iv) 0.1-25 mol % of at least one selected from the group consisting of CuO, $Fe_2O_3$, $Co_2O_3$, MnO, NiO, $Cr_2O_3$, (v) no intentionally added oxides of silicon, and (vi) no intentionally added oxides of aluminum.

Another embodiment of the invention is a solar cell array or module hermetically sealed within a cavity defined by at least two glass plates and a sintered mass of a glass composition connecting the at least two glass plates, the sintered glass composition comprising, prior to firing, (a) a first homogeneous powder glass sealing composition comprising: (i) 25-65 mol % $Bi_2O_3$, (ii) 3-60 mol % ZnO, (iii) 4-65 mol % $B_2O_3$, (iv) 0.1-25 mol % of at least one oxide of a metal selected from the group consisting of iron, cobalt, manganese, nickel, copper and chromium, (v) no intentionally added oxides of silicon, and (iv) no intentionally added oxides of aluminum; and (b) a second homogeneous powder glass sealing composition comprising: (i) 37-45 mol % $Bi_2O_3$, (ii) 30-40 mol % ZnO, (iii) 18-35 mol % $B_2O_3$, (iv) no intentionally added oxides of silicon, and (v) no intentionally added oxides of aluminum.

Still another embodiment of the invention is a sealed assembly of two or more glass plates such as a double pane window, the bonding effectuated by a sintering and flow of glass composition, the sintered glass composition comprising, prior to firing, (a) a first homogeneous powder glass sealing composition comprising: (i) 25-65 mol % $Bi_2O_3$, (ii) 3-60 mol % ZnO, (iii) 4-65 mol % $B_2O_3$, (iv) no intentionally added oxides of silicon, and (v) no intentionally added oxides of aluminum (vi) 0-15 mol % of at least one selected from the group consisting of CuO, $Fe_2O_3$, $Co_2O_3$, MnO, NiO, $Cr_2O_3$; and (b) a second homogeneous powder glass sealing composition comprising: (i) 32-55 mol % $Bi_2O_3$, (ii) 15-45 mol % ZnO, (iii) 10-50 mol % $B_2O_3$, (iv) 0.1-15 mol % of at least one selected from the group consisting of CuO, $Fe_2O_3$, $Co_2O_3$, MnO, NiO, $Cr_2O_3$, (v) no intentionally added oxides of silicon, and (vi) no intentionally added oxides of aluminum.

An embodiment of the invention is a sealed assembly of two or more glass plates such as a double pane window, the bonding effectuated by a sintering and flow of glass composition, the sintered glass composition comprising, prior to firing, (a) a first homogeneous powder glass sealing composition comprising: (i) 25-65 mol % $Bi_2O_3$, (ii) 3-60 mol % ZnO, (iii) 4-65 mol % $B_2O_3$, (iv) no intentionally added oxides of silicon, and (v) no intentionally added oxides of aluminum.

An embodiment of the invention is a sealed assembly of two or more glass plates such as a double pane window, the bonding effectuated by a sintering and flow of glass composition, the sintered glass composition comprising, prior to firing, (a) a first homogeneous powder glass sealing composition comprising: (i) 25-65 mol % $Bi_2O_3$, (ii) 3-60 mol % ZnO, (iii) 4-65 mol % $B_2O_3$, (iv) no intentionally added oxides of silicon, and (v) no intentionally added oxides of aluminum; and (b) a second homogeneous powder glass sealing composition comprising: (i) 37-45 mol % $Bi_2O_3$, (ii) 30-40 mol % ZnO, (iii) 18-35 mol % $B_2O_3$, (iv) 0.1-25 mol % of at least one selected from the group consisting of CuO, $Fe_2O_3$, $CO_2O_3$, MnO, NiO, $Cr_2O_3$, (v) no intentionally added oxides of silicon, and (vi) no intentionally added oxides of aluminum. An embodiment of the invention is an encapsulated MEMS device comprising: (a) a MEMS device, (b) a device wafer comprising silicon or glass, (c) at least one conductive pathway, (d) a cap wafer comprising silicon or glass, (e) a seal comprising a fused glass composition, the fused glass composition comprising prior to fusing, (i) 25-70 mol % $Bi_2O_3$, (ii) 3-60 mol % ZnO, and (iii) 4-65 mol % $B_2O_3$, wherein the cap wafer, the seal, and the device wafer are connected to define a cavity within which the MEMS device is hermetically sealed.

BRIEF DESCRIPTION OF THE DRAWINGS

Reference numerals shown in FIG. 2 are explained below.
  10: p-type silicon substrate
  20: n-type diffusion layer
  30: passivation layer/anti-reflective coating, which can be one of a silicon nitride film, titanium oxide film, or silicon oxide film
  40: p+ layer (back surface field, BSF)
  60: aluminum paste formed on backside
  61: aluminum back electrode (obtained by firing back side aluminum-paste)
  70: silver or silver/aluminum paste formed on backside
  71: silver or silver/aluminum back electrode (obtained by firing back side silver paste)
  500: silver paste formed on front side according to the invention
  501: silver front electrode according to the invention (formed by firing front side silver paste).

DETAILED DESCRIPTION OF THE PREFERRED EMBODIMENTS

The glasses and seals of the invention provide hermeticity and a barrier to moisture and certain gaseous diffusions to protect a variety of electronic circuits and devices by encapsulating them with a glass layer. This encapsulating glass layer may be used to protect an active layer. An active layer may be an OLED, silicon solar cell, thin film solar cells such as CdTe CIGS, organic PV device, plasma display cell, or any of SED, FED, OLED, LCD, DLP, FLD, IMOD, TDEL, nanocrystal display, QDLED, TMOS, TPD, LCL, LPD, or OLET display technologies. Further applications for the glasses and seals of the invention include (a) lead-free low-temperature sealing applications such as glass window sealing, (b) thin film solar cell envelopes such as CdTe CIGS (glass to glass or glass to metal sealing), (c) lead-free MEMS wafer sealing, (d) lead-free solar cell metallization pastes, and (e) low temperature solar cell metallization pastes. Reduced firing temperatures may be realized by use of the inventive glasses in automotive glass enamel applications and laser marking and laser sealing applications as well.

The inventive glasses, while desirable for their flow characteristics when fired at low temperatures, 550° C. or less, preferably 500° C. or less, may ultimately crystallize when heated for an extended period at temperatures of over 375° C., preferably over 400° C. A balance of crystallizing and non-crystallizing fits is ideal for certain sealing applications, for example in MEMS silicon wafers with narrow width seals. Glasses that quickly flow at low firing temperatures but then crystallize upon slight cooling are ideal as the dimensions of the seal are controllable. However, a clear glass coating is obtainable from the inventive frits when fired over a fairly wide, yet low temperature range. More than one glass composition, including 2, 3, 4, or more separate frits can be used.

For example, applications of the glasses of the invention include (a) a solar cell seal made with any glass disclosed herein to protect thin film solar cells such CdTe, CIGS, and CIS; (b) a solar cell seal made with any glass disclosed herein to protect organic photovoltaic devices; (c) a solar cell seal made with any glass disclosed herein to protect silicon solar cells; (d) glass to glass or glass to metal seals made to protect OLED devices, and (e) a glass to glass seal made with any glass disclosed herein for glass windows.

Embodiments of the invention include a solar cell or array, a solar cell module, a MEMS device, OLED device, LED device, or a pair of glass sheets including a hermetic seal, a glass sheet bonded to a metal plate including a hermetic seal, the hermetic seal comprising a fired mass of any combination of glass compositions disclosed herein.

The inventors have discovered that the use of alkali oxides (especially $K_2O$) as well as oxides of chromium, iron, cobalt, manganese, nickel and copper all help to control crystallization and flow characteristics, and light absorption characteristics of the inventive glasses.

Multiple glass systems, preferably two-glass systems provide unique behaviors during firing, sintering, flow, solidification and crystallization, which behaviors cannot be obtained by the use of single-glass systems. This is true even when the final overall composition of a one-glass system is identical to that of a two-glass system or multi-glass system. The inventors have discovered different behavior of the two-glass or multi-glass systems during sintering making the latter more advantageous in many applications than a one-glass system.

Additions of inorganic additives provide a number of beneficial properties such as controlling the thermal expansion of the seal, controlling the flow and crystallization, enhancing the bonding to the substrates, and controlling the light absorption characteristics. The inventors have discovered that crystalline additives such as cordierite, beta-eucryptite, zircon, willemite and crystalline silica (e.g. quartz) are beneficial in controlling the expansion. Additives such as CuO, $Co_3O_4$, Manganese oxides, NiO or Iron oxides can be used to effect adhesion to silicon. These adhesion promoting additives can be in the form of pigmentary oxides such as cobalt aluminate and black oxide spinels. The particle sizes of these additives can range from sub micron to 25 microns, preferably 1 to 15 microns, more preferably 1.5 to 8 microns.

Further pigments, especially black pigments, preferably spinels that contains Cu, Cr, Fe and/or Mn can be used to control the light absorption characteristics of these inventive seal glass/composites when selective heating and sealing techniques are used for sealing. The inventors envision the use of non-spinel based black oxides, such as manganese, nickel, praseodymium, and tin containing compounds. The particle sizes of these pigmentary oxides can range from sub micron to about 10 microns. The inventors realize the additives used for light absorption need not be black alone but rather be absorbing some of the radiation being used for sealing application.

Various embodiments of the invention are set for the hereinbelow.

Embodiments of the invention include a lead-free and cadmium-free sealing glass composition, comprising, prior to firing, (a) $Bi_2O_3$: 25-70 mol %, preferably 25-65 mol %, more preferably 30-60 mol %, still more preferably 32-55 mol %; (b) ZnO: up to 65 mol %, preferably 3-60 mol %, more preferably 150-50 mol %, still more preferably 105-45 mol %; (c) $B_2O_3$: 1-70 mol %, preferably 4-65 mol %, more preferably 7-60 mol %, still more preferably 10-50 mol %, (d) no intentionally added oxides of silicon, and (e) no intentionally added oxides of aluminum. It is preferred that the composition be devoid of oxides of silicon and aluminum. The glasses may further comprise 0.1-15 mol %, preferably 1-10 mol % of at least one selected from the group consisting of CuO, $Fe_2O_3$, $Co_2O_3$, MnO, NiO, $Cr_2O_3$, and combinations thereof. Alkali metal oxides may be included in any embodiment herein, for example at least 0.1-20 mol %, 1 to 15 mol % or 2-12 mol % of $K_2O$ or $Li_2O$ or $Na_2O$ may be present.

A second and/or third glass compositions can be included with the first, that comprising, prior to firing a different glass within the range defined above for the first glass, or in mole % (a) 5-65 ZnO, preferably 7-50, more preferably 10-32; (b) 10-65 $SiO_2$, preferably 20-60, more preferably 22-58, and (c) 5-55 $B_2O_3$, preferably 7-35, more preferably 10-25. This embodiment may further comprise 0.1-15 mol %, preferably 1-10 mol % of at least one selected from the group consisting of CuO, $Fe_2O_3$, $Co_2O_3$, MnO, NiO, $Cr_2O_3$, and combinations thereof. Up to 20 mol % alkali metal oxides, for example at least 0.1 mol % or 1 to 15 mol % $K_2O$ or $Li_2O$ or $Na_2O$ may be present.

The second and/or third glass compositions included with the first glass of this invention, comprise prior to firing in mole % (a) 5-55 alkali oxides, preferably 15-50, more preferably 30-40; (b) 2-26 $TiO_2$, preferably 10-26, more preferably 15-22; (c) 5-75 ($B_2O_3+SiO_2$), preferably 25-70, more preferably 30-52. This embodiment may further comprise 0.25-25 ($V_2O_5+Sb_2O_5+P_2O_5$), more preferably 5-25; up to 20 alkaline earth metal oxides, preferably 0-15, more preferably 0-10; 5-13 F; and 0.1-15 mol %, preferably 1-10 mol % of at least one selected from the group consisting of CuO, $Fe_2O_3$, $Co_2O_3$, MnO, NiO, $Cr_2O_3$, and combinations thereof.

The second and/or third glass compositions included with the first glass of this invention, comprise prior to firing in mole % (a) 15-75 PbO, preferably 25-66, more preferably 50-65; (b) 5-75 ($B_2O_3+SiO_2$), preferably 20-55, more preferably 24-45. This embodiment may further comprise (c) 0.1-35 ZnO, more preferably 0.1-25; (d) up to 30 alkali metal oxides, more preferably up to 10; (e) up to 20 ($TiO_2+ZrO_2$), preferably up to 10, more preferably 0.1-5; and 0.1-15 mol %, preferably 1-10 mol % of at least one selected from the group consisting of CuO, $Fe_2O_3$, $Co_2O_3$, MnO, NiO, $Cr_2O_3$, and combinations thereof. Further it can contain preferably 5-13 mole % F.

An embodiment of the invention includes a lead-free and cadmium-free sealing glass composition, comprising, a first glass frit, comprising, prior to firing: (a) 25-65 mol % $Bi_2O_3$, (b) 3-60 mol % ZnO, (c) 4-65 mol % $B_2O_3$, (c) 0.1-15 mol % of at least one selected from the group consisting of CuO, $Fe_2O_3$, $Co_2O_3$, MnO, NiO, $Cr_2O_3$, and combinations thereof, (d) no intentionally added oxides of silicon, and (e) no intentionally added oxides of aluminum.

Another embodiment of the invention is a method of bonding first and second glass panels to one another, so as to hermetically seal and isolate a cavity defined therebetween, the method comprising (a) providing a first homogeneous powder glass sealing composition comprising: (i) 25-65 mol % $Bi_2O_3$, (ii) 3-60 mol % ZnO, (iii) 4-65 mol % $B_2O_3$, (iv) no intentionally added oxides of silicon, and (v) no intentionally added oxides of aluminum; (b) providing a second homogeneous powder glass sealing composition comprising: (i) 37-45 mol % $Bi_2O_3$, (ii) 30-40 mol % ZnO, (iii) 18-35 mol % $B_2O_3$, (iv) 0.1-15 mol % of at least one selected from the group consisting of CuO, $Fe_2O_3$, $Co_2O_3$, MnO, NiO, $Cr_2O_3$, (v) no intentionally added oxides of silicon, and (vi) no intentionally added oxides of aluminum; (c) mixing the first and second powders form a homogeneous mixture, (d) applying the homogeneous mixture to at least one of the first and second glass plates, (e) positioning the first and second glass plates such that the first and second powders come into contact with both glass plates, (f) firing at a temperature of 400-550° C. to sinter and flow the first and second powders thereby forming a hermetic seal defining a cavity between the first and second plates.

Another embodiment of the invention is a method of bonding first and second glass panels to one another, so as to hermetically seal and isolate a cavity defined there between, the method comprising (a) providing a first homogeneous powder glass sealing composition comprising: (i) 25-65 mol % $Bi_2O_3$, (ii) 3-60 mol % ZnO, (iii) 4-65 mol % $B_2O_3$, (iv) no intentionally added oxides of silicon, and (v) no intentionally added oxides of aluminum; (iv) 0.1-15 mol % of at least one selected from the group consisting of CuO, $Fe_2O_3$, $Co_2O_3$, MnO, NiO, $Cr_2O_3$; (b) providing a second homogeneous powder glass sealing composition in the first glass compositional range but different from first glass; (c) mixing the first and second powders form a homogeneous mixture, (d) applying the homogeneous mixture to at least one of the first and second glass plates, (e) positioning the first and second glass plates such that the first and second powders come into contact with both glass plates, (f) firing at a temperature of 350-550° C., more preferably 400-550° C. to sinter and flow the first and second powders.

Yet another embodiment of the invention is a MEMS device including at least two silicon wafer substrates hermetically sealed with a fired glass powder composition, the powder comprising, prior to firing, (a) 32-55 mol % $Bi_2O_3$, (b) 10-45 mol % ZnO, (c) 10-50 mol % $B_2O_3$, (d) 1.5-9 mol % of at least one selected from the group consisting of CuO, $Fe_2O_3$, $Co_2O_3$, MnO, NiO, $Cr_2O_3$, and combinations thereof, (e) 0.1-20 mol % alkali metal oxides, (e) no intentionally added oxides of silicon, and (f) no intentionally added oxides of aluminum.

Still another embodiment of the invention is a solar cell array or module hermetically sealed within a glass vessel, the glass vessel bonded to at least one cap or cover, the bonding effectuated by a sintered glass composition, the sintered glass composition comprising, prior to firing, (a) a first homogeneous powder glass sealing composition comprising: (i) 25-65 mol % $Bi_2O_3$, (ii) 3-60 mol % ZnO, (iii) 4-65 mol % $B_2O_3$, (iv) no intentionally added oxides of silicon, and (v) no intentionally added oxides of aluminum; and (b) a second homogeneous powder glass sealing composition comprising: (i) 37-45 mol % $Bi_2O_3$, (ii) 30-40 mol % ZnO, (iii) 18-35 mol % $B_2O_3$, (iv) 0.1-15 mol % of at least one selected from the group consisting of CuO, $Fe_2O_3$, $Co_2O_3$, MnO, NiO, $Cr_2O_3$, (v) no intentionally added oxides of silicon, and (vi) no intentionally added oxides of aluminum.

Still another embodiment of the invention is a sealed assembly of two or more glass plates such as a double pane window, the bonding effectuated by a sintering and flow of glass composition, the sintered glass composition comprising, prior to firing, (a) a first homogeneous powder glass sealing composition comprising: (i) 25-65 mol % $Bi_2O_3$, (ii) 3-60 mol % ZnO, (iii) 4-65 mol % $B_2O_3$, (iv) no intentionally added oxides of silicon, and (v) no intentionally added oxides of aluminum (vi) 0-15 mol % of at least one selected from the group consisting of CuO, $Fe_2O_3$, $Co_2O_3$, MnO, NiO, $Cr_2O_3$; and (b) a second homogeneous powder glass sealing composition comprising: (i) 37-45 mol % $Bi_2O_3$, (ii) 30-40 mol % ZnO, (iii) 18-35 mol % $B_2O_3$, (iv) 0.1-15 mol % of at least one selected from the group consisting of CuO, $Fe_2O_3$, $Co_2O_3$, MnO, NiO, $Cr_2O_3$, (v) no intentionally added oxides of silicon, and (vi) no intentionally added oxides of aluminum.

An embodiment of the invention is a method of bonding a cap wafer to a device wafer so as to hermetically seal and isolate a MEMS device in a cavity defined therebetween, the method comprising: (a) providing a green paste including any glass composition set forth herein, (b) depositing the green paste onto at least one of the cap wafer and the device wafer by screen printing; (c) positioning the cap wafer and device wafer in relation to each other such that the paste is positioned therebetween; and (d) heating the cap wafer and device wafer to a temperature above the melting point of the glass component to form a hermetic seal between the cap wafer and device wafer that isolates the MEMS device in the cavity defined therebetween.

Another embodiment of the invention is an apparatus including a MEMS device, wherein the MEMS device is hermetically sealed in a vessel defined by a cap wafer, a device wafer, and a hermetic glass seal, the hermetic glass seal comprising any glass composition disclosed herein.

Yet another embodiment of the invention is a process of sealing a solar cell module in a glass cylinder comprising: (a) positioning a plurality of solar cells in electrical contact with one another inside a glass cylinder, (b) applying any glass composition disclosed herein to at least one of the glass cylinder and a conductive metal endcap designed to fit over the end of the cylinder, (c) bringing the cylinder end, glass composition and endcap into physical contact with one another, and (e) induction heating the glass composition to a temperature of 400-550° C. to provide a hermetic seal between the endcap and cylinder.

Still another embodiment of the invention is a solar cell module comprising a glass cylinder having a transmittance of greater than 80% at 550 nm, in which are situated a plurality of solar cells in electrical contact with one another and a conductive metal endcap, the endcap hermetically sealed to the cylinder by induction heating of a portion of any glass composition disclosed herein.

Another embodiment of the invention is an electronic apparatus including: (a) a MEMS device, (b) at least one substrate comprising at least one of glass, metal, and silicon, and (c) any glass composition disclosed herein. Broadly construed, the inventive seals and glasses comprise at least one glass frit. Further components including inorganic additives, organic additives such as a vehicle, with which to form a paste may be used. Each ingredient is detailed hereinbelow.

Glass Component. The glass compositions are formed in a known manner as, for example, blending the known starting materials and melting at a temperature of about 1000° C. to 1300° C. for sufficient time, typically an hour, depending on the batch size to form a molten glass having the desired composition. The molten glass formed can then be suddenly cooled, e.g., water quenched, in a known manner to form a frit. The frit can then be ground using conventional milling techniques to a particle size, generally in the range of 1 to 25 microns depending on the seal glass application technique. For paste deposition methods the desired particle size is in the range 1 to 15 microns, preferably 2 to 9 microns, more preferably between 3 and 7 microns. This component comprises the disclosed glass frit compositions Useful glass systems herein include, for example, a colorless (or slightly colored) bismuth glass (Bi—Zn—B oxides), which has in general a lower melt point than a colored bismuth glass (Bi—Zn—B and at least one of Co, Cu, Cr, Mn, Ni, Fe oxides). The inventors herein have found that CuO, $Fe_2O_3$, $Co_2O_3$, $Cr_2O_3$, MnO and alkali oxides, especially $K_2O$, can be used to control flow, crystallization and light absorption characteristics of sealing glass compositions. Although additions of PbO and $V_2O_5$ are not preferred for environmental reasons, these oxides can be added to the inventive glasses to control flow characteristics. Similarly the oxides that generally promote wetting such as $Ta_2O_5$, $WO_3$, $MoO_3$, and SnO can also be added to the inventive glasses.

While alumina is generally avoided to maintain a low melting glass, the inventors have found that bonding to silicon (such as wafers in MEMS applications) can be facilitated and improved by the addition of cobalt aluminate and/or copper (II) oxide as crystalline pigmentary additives.

Similarly the inventors have found that glasses containing $Co_2O_3$, $Fe_2O_3$, CuO, and MnO promote bonding to the soda lime silica glass substrates. Useful glasses in the invention include those in Table 1. In the table below, for each oxide with an entry of "no intentional addition," the preferred embodiment is "devoid of all."

TABLE 1

Broad ranges for individual oxides to be used in sealing glass frits.

| Oxide (Mole %) | I | II | III | IV | V |
|---|---|---|---|---|---|
| $Bi_2O_3$ | 25-65 | 30-60 | 32-55 | 35-50 | 37-45 |
| ZnO | 3-60 | 10-50 | 15-45 | 20-40 | 30-40 |
| $B_2O_3$ | 4-65 | 7-60 | 10-50 | 15-40 | 18-35 |
| $SiO_2$ & $Al_2O_3$ | No intentional additions | | | | |
| MgO | No intentional additions | | | | |
| $ZrO_2$ | No intentional additions | | | | |
| $CeO_2$ | No intentional additions | | | | |
| Refractory oxides | No intentional additions | | | | |
| PbO and CdO | No intentional additions | | | | |

TABLE 2

Ranges for individual additional oxides to be used in sealing glass frits in minor amounts.

| | Alternative Oxide Ranges (Mole %) | | | | | |
|---|---|---|---|---|---|---|
| | VI | VII | VIII | IX | X | XI |
| $K_2O$ | 0-15 | 0.1-10 | 0.5-8 | 1-7 | 1.5-5 | 2-4 |
| $Li_2O$ | 0-15 | 0.1-10 | 1-9.5 | 2-9 | 3-8 | 4-8 |
| $La_2O_3$ | 0-15 | 0.1-10 | 1-9 | 2.5-7 | 3-6 | 3.5-5 |
| $Fe_2O_3$ | 0-15 | 0.1-10 | 0.5-8 | 1-7 | 2-6 | 4-5.5 |
| CuO | 0-15 | 0.1-10 | 2-9.5 | 3-9 | 5-8.5 | 6-8.5 |
| $Co_2O_3$ | 0-15 | 0.1-10 | 2-9.75 | 4-9.5 | 6-9 | 7.5-9 |
| MnO | 0-15 | 0.1-10 | 1.5-9 | 2-8 | 4-7 | 4-7 |
| NiO | 0-15 | 0.1-10 | 1.5-9 | 2-8 | 4-7 | 4-7 |
| ($Ta_2O_5$ + $P_2O_5$ + $WO_3$ + $MoO_3$ + SnO) | 0-10 | 0-8 | 0-6 | 0.1-5 | 0.1-4 | 0.1-4 |
| $F_2$ | 0-15 | 0-10 | 0-8 | 1-6 | 2-6 | 2-6 |

Alternative ranges for individual additional oxides in Table 2 include, for CuO, $Fe_2O_3$, $Co_2O_3$, and MnO, in mol %: 1.5-9, 2-8 and 4-7. Alternate ranges for $La_2O_3$ include 0.5-8, 2-6 and 1-6 mol %.

Oxides in tables 2 or 4, including the alternatives in the preceding paragraph, can be used in any amount disclosed in any column together with oxides from table 1 or 3. Amounts from different columns in tables 2 or 4 can be used with amounts of oxides from any column in table 1 or 3.

It is to be noted that part of these glass oxides such as $Bi_2O_3$, ZnO, CuO, $Fe_2O_3$, $Co_2O_3$, MnO, can be included as ceramic oxide additives in the seal materials to obtain the final overall glass compositions envisioned here.

As mentioned previously multiple glasses, preferably glass mixtures of two or three frits can be used to control the overall properties of the seal. If a second glass composition is used, the proportions of the glass compositions can be varied to control the extent of paste interaction with substrates such as silicon, flow and crystallization characteristics of the seal and hence the resultant seal properties. For example, within the glass component, the first and second glass compositions may be present in a weight ratio of about 1:20 to about 20:1, and preferably about 1:5 to about 5:1. The glass component preferably contains no lead or oxides of lead, and no cadmium or oxides of cadmium. However, in certain embodiments where the properties of PbO cannot be duplicated, such embodiments advantageously comprise PbO. Further the second or third glass can be another bismuth glass from Tables 1 & 2, or a zinc glass (Table 3) or alkali titanium silicate glass (Table 4) or a lead glass (Table 5).

TABLE 3

Oxide frit ingredients for zinc based additive glasses in mole percent.

| Glass Composition Ingredient [Mole %] | XII | XIII | XIV |
|---|---|---|---|
| ZnO | 5-65 | 7-50 | 10-32 |
| $SiO_2$ | 10-65 | 20-60 | 22-58 |
| $B_2O_3$ | 5-55 | 7-35 | 10-25 |

TABLE 4

Oxide frit ingredients for alkali-titanium-silicate additive glasses in mole percent.

| Glass Composition Ingredient [Mole %] | XV | XVI | XVII |
|---|---|---|---|
| $Li_2O$ + $Na_2O$ + $K_2O$ | 5-55 | 15-50 | 30-40 |
| $TiO_2$ | 2-26 | 10-26 | 15-22 |
| $B_2O_3$ + $SiO_2$ | 5-75 | 25-70 | 30-52 |
| $V_2O_5$ + $Sb_2O_5$ + $P_2O_5$ | 0-30 | 0.25-25 | 5-25 |
| MgO + CaO + BaO + SrO | 0-20 | 0-15 | 0-10 |
| F | 0-20 | 0-15 | 5-13 |

TABLE 5

Oxide frit ingredients for lead based additive glasses in mole percent.

| Glass Composition Ingredient [Mole %] | XVIII | XIX | XX |
|---|---|---|---|
| PbO | 15-75 | 25-66 | 50-65 |
| $B_2O_3$ + $SiO_2$ | 5-75 | 20-55 | 24-45 |
| ZnO | 0-55 | 0.1-35 | 0.1-25 |
| $Li_2O$ + $Na_2O$ + $K_2O$ | 0-40 | 0-30 | 0-10 |
| $TiO_2$ + $ZrO_2$ | 0-20 | 0-10 | 0.1-5 |

Other additives, such as ceramic powders, can be used to tailor the expansion (CTE) of composite glass compositions. The inventive glasses have CTEs in the range of about 85-130 $\times 10^{-7}/°$ C. Ceramic powders such as cordierite, Beta-ecryptite, zircon, crystalline silica (such as quartz), alumina and zirconia have CTEs in the range of 0-100× $10^{-7}/°$ C. Hence, glasses with CTEs in the overall range of 30-130×$10^{-7}/°$ C. can be formulated. Such are used only to the extent that they do not increase the melt point of a frit formed therewith beyond 550° C., more preferably 500° C.

Other additives, such as $Al_2O_3$, AlN, SiC, $Si_3N_4$, diamond, silicon, carbon, BN, $TiO_2$, $ZrO_2$ can be used to tailor the thermal conductivity and thermal diffusivity of the sealing glass materials of these inventive glass materials.

In formulating the pastes, the glass fits typically have particle sizes of about 0.5 to about 10 microns, although other particle sizes may be used as known in the art.

Organic Vehicle. While the seals of the invention may be fabricated without them, the glasses herein in some instances may be suspended in vehicle or carrier which is typically a solution of a resin dissolved in a solvent and, frequently, a solvent solution containing both resin and a thixotropic agent. A paste is formed thereby. The organics portion of the paste comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, resin, thixotrope, and/or wetting agent is also envisioned. Ethyl cellulose is a commonly used resin. However, resins such as ethyl hydroxyethyl cellulose, wood rosin, mixtures of ethyl cellulose and phenolic resins, polymethacrylates of lower alcohols and the monobutyl ether of ethylene glycol monoacetate can also be used. Solvents having boiling points (1 atm) from about 130° C. to about 350° C. are suitable. Widely used solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate. Vehicles having product numbers 431 and 610 from Ferro Corporation are also useful.

Although organic vehicles are generally used for preparing screen printable or extrudable pastes, it is envisioned that water based vehicle systems can be used with these inventive frits to form a slurry. Alternately, the slurry could be formulated to a viscosity providing a sprayable consistency.

The inventors have discovered that these sealing glasses and seal composites can be cast into tape form by making green tapes from casting a tape slurry whose organics typically contain a thermoplastic polymer such as PVB resin, a platicizer, solvent and optionally a dispersant as specified in commonly owned U.S. Pat. No. 7,547,369, which is fully incorporated herein by reference.

Heating. To form the seals of the invention, the glass compositions may be heated, that is, sintered, by any means known in the art. For example, furnace heating, induction heating, microwave heating, high-intensity visible light irradiation heating, IR irradiation heating and laser irradiation heating are suitable. In the case of sealing MEMS wafers, furnace firing wherein a platen is heated resistively and conduct the heat to the silicon wafer and then to the seal is used. For window sealing heating such as furnace heating or fast fire IR irradiation heating can be employed. For sealing of solar cells, apart from furnace sealing, selective sealing methods such as laser sealing can be employed to selectively heat the seal while keeping the enclosed solar cells at relatively low temperatures. For the foregoing methods, suitable absorbers broadly disclosed earlier can be employed. Broadly, the process of laser sealing disclosed herein begins with prefiring an IR-transparent enamel composition on a top glass plate. An IR-absorbing enamel (e.g., pigmented) is then prefired to a bottom glass plate. Alternately, IR-transparent enamels are prefired to each of top and bottom glass plates, and a portion of IR-absorbing enamel is applied to one of the IR-transparent enamel prefires. A laser is fired through the top substrate and through the upper IR-absorbing material to fuse the portion of IR-absorbing enamel, and thereby complete the seal. Further it is envisioned that the sealing glass can all be on one glass plate. The second glass plate without any enamel can be placed on top of it and sealed together, by firing the laser through the top (enamel free) glass plate and directly to the enamel on the bottom plate.

Prefiring eliminates the need to process a large mass of sealing material in a solar cell fabrication facility, and prevents excess heating of the photovoltaic device. Contamination from binder burnout is eliminated, as no organic binder is needed. In the aggregate, the sealing process carried out by the procedures outlined herein are faster than conventional processes, largely because the prefiring reduces the mass of frit that must be heated by firing at the moment of seal formation. Stated differently, the amount of heat that must be imparted to the seal is far less at the moment of seal fusion because the sealing glasses have been preheated.

Although prefiring is desired, a one-step firing process that combines the prefiring and sealing firing is also envisioned and has been achieved with the inventive sealing glass materials. Further envisioned is a one-step firing process along with application of sealing material on one glass plate or metal plate and sealing to the other clear glass plate as a means to increase production speed.

A major application of the hermetic seals of the invention is the sealing of a plurality of solar cells in a solar cell module or array. Solar cells are generally made of semiconductor materials, such as silicon (Si), CdTe, CIGS which convert sunlight into useful electrical energy. Silicon based solar cells are relatively inert to moisture attack. Therefore they can be encapsulated between glass plate and organic back sheet using epoxies. However, thin film solar cells based on CdTe, CIGS, including their electrical leads are susceptible to moisture attack in their projected 20+ years lifetime. Therefore hermetic sealing of these thin film solar cells between glass plates using glass seals can be pursued to extend their service life time.

The inventive low temperature sealing glasses, can be used as additives to the solar cell metallization thick film pastes, silver based front contact, aluminum based back contact and silver-aluminum based back contact pastes to lower the overall firing temperatures of the crystalline silicon solar cells.

The glasses of the invention can be used to formulate seals to encapsulate MEMS devices between substrates, seals for architectural windows, seals for encapsulating solar cells or pastes for use in fabricating solar cell contacts. Examples of these follow, first a MEMS device, followed by an example of how to fabricate solar cell contacts is presented hereinbelow, together with accompanying drawings.

Figure 1:
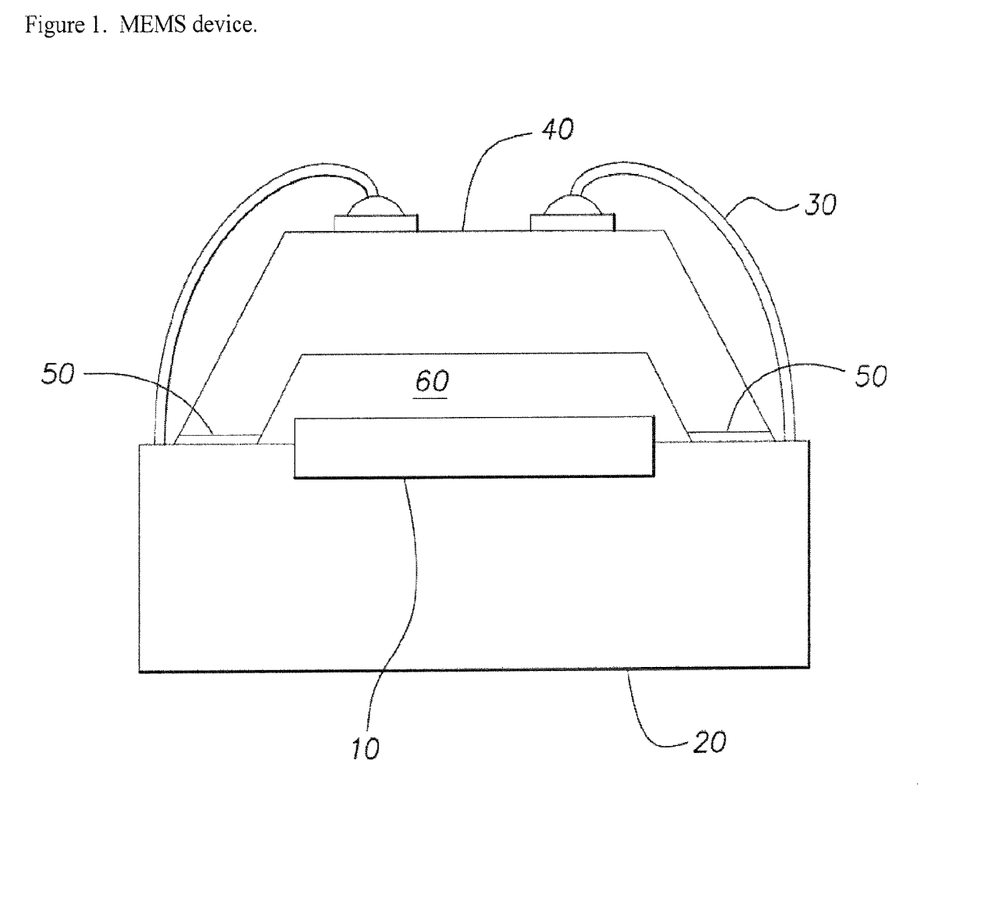
FIG. 1 is a schematic of a stylized MEMS device as known in the art.

MEMS Device. FIG. 1 shows a schematic cross-section view of an exemplary microelectromechanical systems ("MEMS") device 10 formed in or on a device wafer 20 made of silicon or glass (for some optical MEMS). The MEMS device 10 could be an accelerometer, rate sensor, actuator, pressure sensor etc. Signal lines 30, a portion of which may be formed in the device wafer 20, electrically connect the MEMS device 10 to a microprocessor and/or to other circuitry (not shown). A cap wafer 40 made of silicon or glass is bonded to the device wafer 20 using a sealing glass composition, which is melted and re-solidified to form a hermetic glass seal 50 between the cap wafer 40 and the device wafer 20. The cap wafer 40, the hermetic glass seal 50 and the device wafer 20 thus cooperate to define a package comprising a cavity 60 within which the MEMS device 10 is enclosed and protected. A hermetic seal 50 between the cap wafer and the device wafer also ensures that moisture, air dust and other foreign matter are excluded from the cavity, which could lead to the formation of ice crystals at low temperatures and/or otherwise impede the operation of the MEMS device.

Figure 2A:
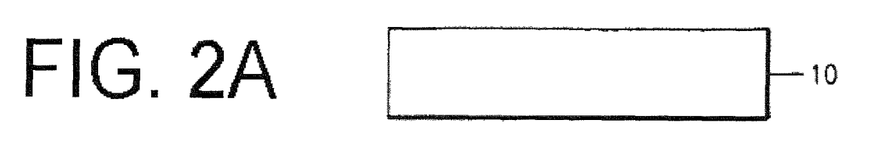
FIG. 2 is a process flow diagram illustrating the fabrication of a semiconductor device.

Procedure for Solar Cell Contact Production. Referring now to FIGS. 2A-2E, a solar cell front contact according to the present invention generally can be produced by applying any silver-based paste to a solar grade Si wafer. In particular, FIG. 2A shows a step in which a substrate of single-crystal silicon or multicrystalline silicon is provided typically, with a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 microns of the substrate surface using an aqueous alkali solution such as KOH or NaOH, or using a mixture of HF and $HNO_3$. The substrate optionally may be washed with a mixture of HCl and $H_2O_2$ to remove heavy metals such as iron that may adhere to the substrate surface. An antireflective textured surface is sometimes formed thereafter using, for example, an aqueous alkali solution such as aqueous potassium hydroxide or aqueous sodium hydroxide. This gives the substrate, 10, depicted with exaggerated thickness dimensions, as a typical silicon wafer is ca. 200 microns thick.

Figure 2B:
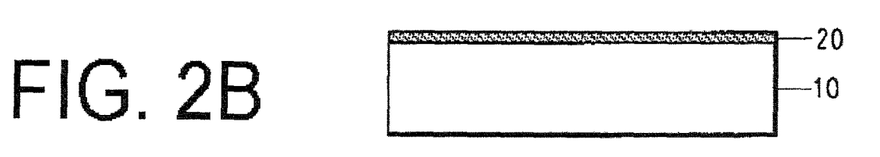

Referring to FIG. 2B, when the substrate used is a p-type substrate, an n-type layer 20 is formed to create a p-n junction. A phosphorus diffusion layer is supplied in any of a variety of suitable forms, including phosphorus oxychloride ($POCl_3$), and other phosphorus sources including organophosphorus compounds, and others disclosed herein. The phosphorus source may be selectively applied to only one side of the silicon wafer. The depth of the diffusion layer can be varied by controlling the diffusion temperature and time, is generally about 0.3 to 0.5 microns, and has a sheet resistivity on the order of about 40 to about 100 ohms per square. The phosphorus source may include phosphorus-containing liquid coating material such as phosphosilicate glass (PSG) is applied onto only one surface of the substrate by a process, such as spin coating, and diffusion is effected by annealing under suitable conditions.

Figure 2C:
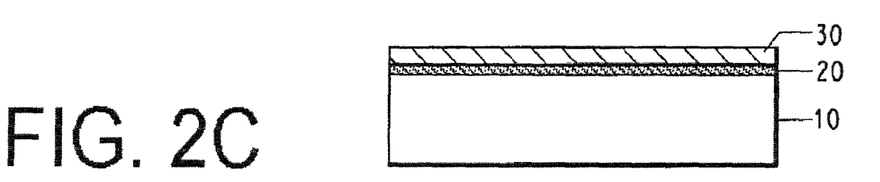

Next, in FIG. 2C, an antireflective coating (ARC)/passivating film 30, which may be $SiN_x$, $TiO_2$ or $SiO_2$, is formed on the above-described n-type diffusion layer, 20. Silicon nitride film is sometimes expressed as $SiN_x$:H to emphasize passivation by hydrogen. The ARC 30 reduces the surface reflectance of the solar cell to incident light, increasing the electrical current generated. The thickness of ARC 30 depends on its refractive index, although a thickness of about 700 to 900 Å is suitable for a refractive index of about 1.9 to 2.0. The ARC may be formed by a variety of procedures including low-pressure CVD, plasma CVD, or thermal CVD. When thermal CVD is used to form a $SiN_x$ coating, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a substantially stoichiometric compositional ratio between the silicon and the nitrogen—$Si_3N_4$. Other methods of forming an ARC are known in the art.

Figure 2D:
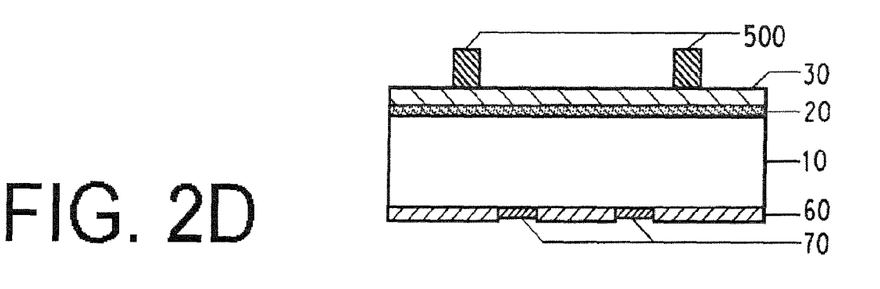

As shown in FIG. 2D, a silver paste 500 for the front electrode is screen printed then dried over the silicon nitride film 30. In addition, back side silver or silver/aluminum paste 70 and an Al paste 60 are then screen printed and successively dried on the backside of the substrate. The Al paste may include one or more glass frits from Tables 1-5, above, or Table 6, below. Firing is then carried out in an infrared belt furnace at a temperature range of approximately 700° C. to 975° C. for a period of from about a minute to about several minutes.

Figure 2E:
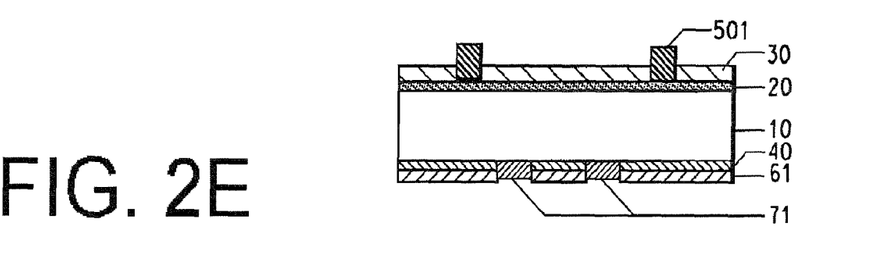

Consequently, as shown in FIG. 2E, aluminum from the Al paste melts and reacts with the silicon substrate 10 during firing, then solidifies forming a p+ layer, 40, containing a high concentration of aluminum dopant. This layer is generally called the back surface field (BSF) layer, and helps to improve the energy conversion efficiency of the solar cell.

The Al-paste is transformed by firing from a dried state 60 to an aluminum back contact 61. The backside silver or silver/aluminum paste 70 is fired at the same time, becoming a silver or silver/aluminum back contact 71. During firing, the boundary between the back side Al and the back side silver or silver/aluminum assumes an alloy state, and is connected electrically as well. The back contact is largely covered with the Al-paste, to a wet thickness of about 30 to 50 microns, owing in part to the need to form a thicker p+ layer 40. The back side silver paste areas are used for tab attachment during module fabrication. In addition, the front electrode-forming silver paste 500 sinters and penetrates through (i.e., fires through) the silicon nitride film 30 during firing, and is thereby able to electrically contact the n-type layer 20. This fired through state is apparent in layer 501 of FIG. 2E.

Figure 3:
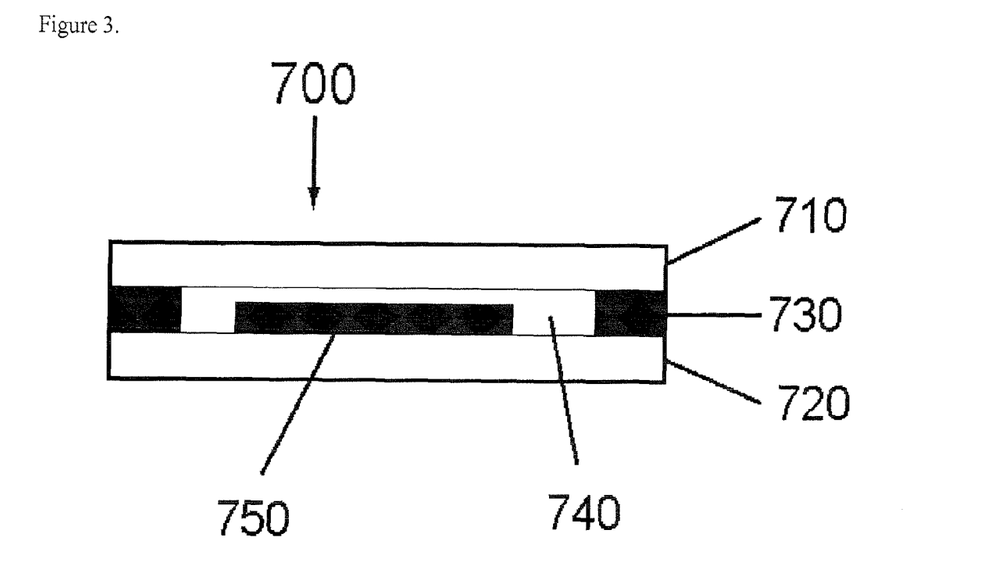
FIG. 3 depicts a solar encapsulated in glass plates and the sealing glass of the invention.

FIG. 3 depicts embodiments where a solar cell or solar cell module is encapsulated in a hermetically sealed cavity formed by two glass plates and seals made of the sealing glasses disclosed herein. In particular, hermetically sealed solar cell 700 includes top glass plate 710, and bottom glass plate 720, which are sealed together by sealing glass 730, which is any glass composition of the invention. Hermetically sealed cavity 740 is created and defined by top and bottom glass plates 710 and 720 as sealed together by sealing glass 730. Inside cavity 740 may be located solar cell 750 which is enclosed and protected thereby. An organic polymeric material can also be present inside cavity 740 for added protection to the encapsulated solar cell 750. The hermetic seal formed by glass plates 710 and 720 and sealing glass 730 also ensures that moisture, air dust and other foreign matter are excluded from the cavity, which could lead to the formation of ice crystals at low temperatures and/or otherwise impede the operation of the solar cell. Although the hermetic seal is shown in between two glass plates, the seal can be located in different configuration such as at the sides to bond two glass plates together

EXAMPLES

Exemplary glass and paste formulations of the invention can be found in tables 6 and 7, below.

TABLE 6

Low Melting Bismuth Glass compositions of the Invention.

| | Oxide (mol %) | | | | | | | | | | | | | | | |
|---|---|---|---|---|---|---|---|---|---|---|---|---|---|---|---|---|
| Glass | 1 | 2 | 3 | 4 | 5 | 6 | 7 | 8 | 9 | 10 | 11 | 12 | 13 | 14 | 15 | 16 |
| $Bi_2O_3$ | 25 | 45.7 | 50 | 42.5 | 44.7 | 55.7 | 38.7 | 43.6 | 40.9 | 40.7 | 60 | 35.3 | 39.0 | 33.4 | 42.5 | 36.6 |
| ZnO | 50 | 31.9 | 30 | 37.2 | 31.6 | 15.0 | 34.1 | 30.8 | 36.1 | 35.9 | 20 | 31.1 | 34.4 | 29.4 | 35 | 32.3 |
| $B_2O_3$ | 25 | 22.4 | 20 | 20.0 | 21.0 | 29.3 | 18.2 | 20.5 | 19.2 | 19.1 | 20 | 16.6 | 18.3 | 15.7 | 15 | 17.2 |
| $K_2O$ | | | | | | 2.6 | | | | 2.6 | | | | | | |

TABLE 6-continued

Low Melting Bismuth Glass compositions of the Invention.

| | Oxide (mol %) | | | | | | | | | | | | | | | |
|---|---|---|---|---|---|---|---|---|---|---|---|---|---|---|---|---|
| Glass | 1 | 2 | 3 | 4 | 5 | 6 | 7 | 8 | 9 | 10 | 11 | 12 | 13 | 14 | 15 | 16 |
| $Li_2O$ | | | | | | | | | | | | | | | 7.5 | |
| $La_2O_3$ | | | | | | | | | 3.9 | | | | | | | |
| CuO | | | | | | | | | | | | | 8.4 | 21.5 | | |
| MnO | | | | | | | | | | | | 17.0 | | | | |
| $Fe_2O_3$ | | | | | | | | | | 4.4 | | | | | | |
| $Co_2O_3$ | | | | | | | 8.85 | | | | | | | | | |
| SnO | | | | | | | | | | | | | | | | 13.9 |
| BaO | | | | | | | 2.6 | | | | | | | | | |

TABLE 7

Inorganic portion of pastes made with glasses of Table 6.

| Inorganics (wt %) | A | B | E | G | I | K |
|---|---|---|---|---|---|---|
| Glass 3 powder | | 89.3 | 85.5 | 89.3 | | |
| Glass 5 powder | 95 | | | | 96.5 | 95 |
| EG0225 powder | 5 | 4.7 | | 4.7 | 3.5 | 3.5 |
| CuO | | | 4 | | | 0.75 |
| $MnO_2$ | | 6 | | | | |
| Zircon | | | 4.5 | | | |
| K393-2 black pigment | | | | 6 | | |
| V9250 blue pigment | | | 6 | | | 0.75 |

The glass powders had an average particle size (D50) 3 to 7 micron in size. The particle size (D50) specified here is for reference, and one well versed in this art could use other D50 from 1 micron to 20 micron depending on the application method and seal dimensions. Glass powders 1-6, 8, 9, 11, 15, and 16 in Table 6 have a flow temperature range of about 425-470° C. and crystallize at about 480-500° C., and are considered "crystallizing" frits. Glass powders 7, 10, and 12-14 in Table 6, which include 0.1-25 mol % of one colorant selected from the group consisting of CuO, $Fe_2O_3$, $Co_2O_3$, MnO, NiO, $Cr_2O3$, have a higher flow temperature range of about 480-500° C., and are considered "non-crystallizing" frits. When a homogeneous mixture of crystallizing frit and non-crystallizing frit is fired, the crystallizing frit particles can melt and flow at the relatively low temperature of 425-470° C., while the non-crystallizing frit particles remain as solid particles. When the mixture is heated further, for example to about 480-500° C., the melted crystallizing frit composition will begin to crystalize, while the non-crystallizing frit particles will melt and flow. This characteristic of including two separate populations of frit thus provides a wider flow temperature range of about 425-500° C. for the homogenous mixture.

Paste compositions are made from the inorganics formulations in Table 7. All have the following constituents, in wt %. 87.6% inorganics, 9.8% Vehicle 431, 2.3% Vehicle 610, and 0.3% Texanol®. EG0225 glass, S46/6 glass, and all pigments and vehicles used herein are commercially available from Ferro Corporation, Cleveland, Ohio.

TABLE 8

Properties of Exemplary Bismuth Glasses of the Invention

| Oxides, mole % | 2 | 3 | 5 | 4 | 7 | 10 | 13 |
|---|---|---|---|---|---|---|---|
| CTE × $10^{-7}$/° C. | 107 | 112 | 113 | 102 | 107 | 121 | 105 |
| Tg, ° C. | 341 | 337 | 343 | 347 | 361 | 372 | 348 |
| Ts, ° C. | 375 | 365 | 376 | 378 | 390 | 401 | 379 |

TABLE 9

Glass Composites of the Invention

| Ingredient, wt % | L | M | N |
|---|---|---|---|
| Glass 5 powder | 82 | 92.5 | 95 |
| EG0225 glass powder | 18 | 7.5 | |
| Zircon | | | 5 |
| CTE × $10^{-7}$/° C. | 62.1 | 80.2 | 96.4 |
| Ts, ° C. | 394 | 387 | 393 |

With respect to the glasses and composites of Tables 6 to 9, many of such glasses eventually crystallize when fired at temperatures over 450° C. when heated for an extended period. EG0225 is commercially available from Ferro Corporation, Cleveland, Ohio. However, when properly heated, these sealing glasses flow well before crystallization could arrest their flows.

In particular, glass composites (Table 10) comprising glasses 7 and 10 from Table 6 are particularly well suited for use in sealing glass panels used for making vacuum insulated glass windows. Additionally, high bismuth sealing glasses are well suited for use in sealing silicon solar cells as well as for encapsulating solar cell panels especially thin film solar cells comprising CdTe, CIGS, CIS or tempered glass panels or sealing containers that house a plurality of solar cells as in a solar array.

TABLE 10

Glass Composites of the Invention

| Ingredient, wt % | P | Q | R | T | U |
|---|---|---|---|---|---|
| Glass 15 powder | 45.8 | | | | |
| Glass 7 powder | | | 45.8 | 46.0 | 41.8 |
| Glass 10 powder | 45.8 | 45.8 | 45.8 | 46.0 | 41.8 |
| S46/6 glass | | 49.5 | | | |
| EG0225 glass | 7.4 | 3.7 | 7.4 | 7.5 | 7.7 |
| K393-2 pigment | 1 | 1 | 1 | 0.5 | 8.7 |
| CTE × $10^{-7}$/° C. | 86.5 | 80.5 | 82.0 | 81.0 | 89.7 |
| Ts, ° C. | 392 | 499 | 395 | 447 | 456 |

Glass plates sealed with some of the sealing glass composites of Table 10 and made according to the methods herein have been tested to meet thermal cycling performance standards established under IEC 61646 clauses 10.11 to 10.13. In solar cells, clauses 10.11 through 10.13 are particularly relevant. Importantly, clause 10.13, entitled "damp heat" is of particular interest. A sealed PV cell must be able to withstand 1000 hours without breaking the seal, when subjected to a chamber at 85° C. and 85% humidity. Certain of the inventive seals and glasses herein have withstood 2000 hours under such conditions Certain embodiments of the invention are envisioned where at least some percentages, temperatures, times, and ranges of other values are preceded by the modifier "about." "Comprising" is intended to provide support for "consisting of" and "consisting essentially of." All compositional percentages for glass compositions are by mole percent. Formulations for pastes are by weight. All such formulations are given for a blend prior to firing. Numerical ranges of oxides or other ingredients that are bounded by zero on the lower end (for example, 0-10% ZnO) are intended to provide support for the concept "up to [the upper limit]," for example "up to 10% SnO" as well as a positive recitation that the ingredient in question is present in an amount that does not exceed the upper limit. A preferred embodiment for any range bounded by zero is the range bounded by 0.1% at the lower limit. An example of the latter is "comprises SnO, provided the amount does not exceed 10%." A recitation such as "8-25% ($Li_2O+Na_2O+K_2O$)" means that any or all of $Li_2O$, $Na_2O$ and/or $K_2O$ may be present in an amount of 8-25% of the composition.

All ranges disclosed herein are to be understood to encompass the beginning and ending range values and any and all subranges therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1.0 to 2.7, 3.3 to 8.9, 5.7 to 10, etc.

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

The invention claimed is:

1. A method of bonding first and second substrates to one another, so as to hermetically seal and isolate a cavity defined therebetween, the method comprising,
    a. providing a first glass frit, wherein the first glass frit is prepared by blending first starting materials, heating the first starting material to form a first molten glass, and quenching the first molten glass to form the first glass frit comprising:
        i. 25-65 mol % $Bi_2O_3$,
        ii. 3-60 mol % ZnO,
        iii. 4-65 mol % $B_2O_3$,
        iv. no intentionally added oxides of silicon, and
        v. no intentionally added oxides of aluminum,
        vi. no intentionally added oxides of zirconium,
        vii. no intentionally added refractory oxides,
        viii. no intentionally added oxides of lead, and
        ix. no intentionally added oxides of cadmium,
    b. providing a second glass frit wherein the second glass frit is prepared by blending second starting materials, heating the second starting material to form a second molten glass, and quenching the second molten glass to form the second glass frit comprising:
        i. 25-65 mol % $Bi_2O_3$,
        ii. 3-60 mol % ZnO,
        iii. 4-65 mol % $B_2O_3$,
        iv. 0.1-25 mol % of at least one colorant selected from the group consisting of CuO, $Fe_2O_3$, $Co_2O_3$, MnO, NiO, $Cr_2O_3$,
        v. no intentionally added oxides of silicon, and
        vi. no intentionally added oxides of aluminum,
        vii. no intentionally added oxides of zirconium,
        viii. no intentionally added refractory oxides,
        ix. no intentionally added oxides of lead, and
        x. no intentionally added oxides of cadmium,
    c. mixing the first and second glass frits to form a homogeneous mixture,
    d. applying the homogeneous mixture to at least one of the first and second substrates,
    e. positioning the first and second substrates such that the first and second glass frits come into contact with both substrates,
    f. firing at a temperature of 300-600° C. to sinter and flow the first and second glass frits thereby forming a hermetic seal defining a cavity between the first and second substrates,
    wherein the one of the first and second substrates is glass and the other substrate is selected from the group consisting of glass, metal and silicon; and
    wherein the first glass frit has a lower melting point than the second glass frit.

2. The method of claim 1, wherein at least one solar cell is contained in the cavity defined between the first and second substrates.

3. The method of claim 1, wherein at least one MEMS device is contained in the cavity defined between the first and second substrates.

4. The method of claim 1, wherein both substrates are glass panels and the glass panels are architectural window glass panels.

5. The method of claim 1, wherein the colorant is selected from the group consisting of $Fe_2O_3$, $Co_2O_3$, and MnO.

6. The method of claim 1, wherein the colorant is CuO.

7. The method of claim 1, wherein at least one of the first and second glass frits further comprises 0.1-20 wt % alkali oxide.

8. The method of claim 1, wherein the first substrate is a cap wafer and the second substrate is a device wafer, and wherein a MEMS device is sealed in the cavity isolated between the cap wafer and substrate wafer.

9. The method of claim 1, wherein
    a. the first glass frit comprises:
        i. 30-60 mol % $Bi_2O_3$,
        ii. 10-50 mol % ZnO,
        iii. 7-60 mol % $B_2O_3$,
        iv. no intentionally added oxides of silicon, and
        v. no intentionally added oxides of aluminum,
        vi. no intentionally added oxides of zirconium,
        vii. no intentionally added refractory oxides,
        viii. no intentionally added oxides of lead, and
        ix. no intentionally added oxides of cadmium,
    b. the second glass frit comprises:
        i. 35-50 mol % $Bi_2O_3$,
        ii. 20-40 mol % ZnO,
        iii. 15-40 mol % $B_2O_3$,
        iv. 0.1-25 mol % of at least one colorant selected from the group consisting of CuO, $Fe_2O_3$, $Co_2O_3$, MnO, NiO, $Cr_2O_3$,
        v. no intentionally added oxides of silicon, and
        vi. no intentionally added oxides of aluminum,
        vii. no intentionally added oxides of zirconium,
        viii. no intentionally added refractory oxides,
        ix. no intentionally added oxides of lead, and
        x. no intentionally added oxides of cadmium.

10. The method of claim 1, wherein
    a. the first glass frit comprises:
        i. 37-45 mol % $Bi_2O_3$,
        ii. 30-40 mol % ZnO,
        iii. 18-35 mol % $B_2O_3$, iv. no intentionally added oxides of silicon, and
v. no intentionally added oxides of aluminum,
vi. no intentionally added oxides of zirconium,
vii. no intentionally added refractory oxides,
viii. no intentionally added oxides of lead, and
ix. no intentionally added oxides of cadmium,
b. the second glass frit comprises:
i. 35-50 mol % $Bi_2O_3$,
ii. 20-40 mol % ZnO,
iii. 15-40 mol % $B_2O_3$,
iv. 0.1-25 mol % of at least one colorant selected from the group consisting of CuO, $Fe_2O_3$, $Co_2O_3$, MnO, NiO, $Cr_2O_3$,
v. no intentionally added oxides of silicon, and
vi. no intentionally added oxides of aluminum,
vii. no intentionally added oxides of zirconium,
viii. no intentionally added refractory oxides,
ix. no intentionally added oxides of lead, and
x. no intentionally added oxides of cadmium.

11. The method of claim 1, wherein both of the first and second glass frits include no intentional additions of at least one selected from the group consisting of MgO, $ZrO_2$, $CeO_2$, refractory oxides, PbO and CdO.

12. The method of claim 1, wherein both of the first and second glass frits include no intentional additions of at least two selected from the group consisting of MgO, $ZrO_2$, $CeO_2$, refractory oxides, PbO and CdO.

13. The method of claim 1, wherein both of the first and second glass frits include no intentional additions of MgO, $ZrO_2$, $CeO_2$, refractory oxides, PbO and CdO.

14. The method of claim 1, wherein both of the first and second glass frits include no intentional additions of at least one selected from the group consisting of MgO, $ZrO_2$, $CeO_2$, refractory oxides, PbO and CdO.

15. The method of claim 1, wherein both of the first and second glass frits include no intentional additions of at least one selected from the group consisting of MgO, $ZrO_2$, $CeO_2$, refractory oxides, PbO and CdO.

16. The method of claim 1, wherein the first glass frit crystallizes during firing and the second glass frit does not crystallize during firing.

17. The method of claim 1, wherein the amount of $Bi_2O_3$ in the first glass frit is 55-60 mol %.

18. The method of claim 1, wherein the amount of ZnO in the first glass frit is 3-20 mol %.

19. The method of claim 1, wherein the amount of ZnO in the first glass frit is 36-50 mol %.

20. The method of claim 1, wherein the amount of $B_2O_3$ in the first glass frit is 26-60 mol %.

21. A method of sealing a solar cell module in a glass cylinder comprising:
a. positioning a plurality of solar cells in electrical contact with one another inside a glass cylinder,
b. applying a homogeneous mixture to at least one of the glass cylinder and a conductive metal endcap designed to fit over the end of the cylinder
c. bringing the cylinder end, homogeneous mixture and endcap into physical contact with one another, and
d. induction heating the homogeneous mixture to a temperature of 400-600° C. to provide a hermetic seal between the endcap and cylinder,
wherein the homogeneous mixture comprises
i. a first glass frit mixture, wherein the first glass frit is prepared by blending first starting materials, heating the first starting material to form a first molten glass, and quenching the first molten glass to form the first glass frit comprising:
1. 25-65 mol % $Bi_2O_3$,
2. 3-60 mol % ZnO,
3. 4-65 mol % $B_2O_3$,
4. no intentionally added oxides of silicon, and
5. no intentionally added oxides of aluminum, and
ii. a second glass frit, wherein the second glass frit is prepared by blending second starting materials, heating the second starting material to form a second molten glass, and quenching the second molten glass to form the second glass frit comprising:
1. 25-65 mol % $Bi_2O_3$,
2. 3-60 mol % ZnO,
3. 4-65 mol % $B_2O_3$,
4. 0.1-25 mol % of at least one colorant selected from the group consisting of CuO, $Fe_2O_3$, $Co_2O_3$, MnO, NiO, and $Cr_2O_3$
5. no intentionally added oxides of silicon, and
6. no intentionally added oxides of aluminum, and
wherein the first glass frit has a lower melting point than the second glass frit.

22. The method of claim 21, wherein the colorant is selected from the group consisting of $Fe_2O_3$, $Co_2O_3$, and MnO.

23. The method of claim 21, wherein the colorant is CuO.

24. The method of claim 21, wherein at least one of the first and second glass frits further comprises 0.1-20 wt % alkali oxide.

* * * * *